United States Patent
Hayashi et al.

(10) Patent No.: US 9,382,938 B2
(45) Date of Patent: Jul. 5, 2016

(54) SPRUNG WASHER AND FIXING DEVICE

(71) Applicant: FUJITSU LIMITED, Kawasaki-shi, Kanagawa (JP)

(72) Inventors: Mitsuaki Hayashi, Kawasaki (JP); Osamu Saito, Kawasaki (JP); Wataru Takano, Osaka (JP); Takaharu Izuno, Kawasaki (JP); Kenji Joko, Yokohama (JP); Hideaki Matsumoto, Yokohama (JP); Takashi Shirakami, Kawasaki (JP); Minoru Fujii, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 207 days.

(21) Appl. No.: 14/052,930

(22) Filed: Oct. 14, 2013

(65) Prior Publication Data

US 2014/0161558 A1 Jun. 12, 2014

(30) Foreign Application Priority Data

Dec. 6, 2012 (JP) ................... 2012-267456

(51) Int. Cl.
*F16B 43/00* (2006.01)
*H01L 23/40* (2006.01)
*F16B 5/02* (2006.01)

(52) U.S. Cl.
CPC ............ *F16B 43/00* (2013.01); *H01L 23/4006* (2013.01); *F16B 5/0266* (2013.01); *H01L 2023/4075* (2013.01); *H01L 2023/4081* (2013.01); *H01L 2924/0002* (2013.01)

(58) Field of Classification Search
CPC ............... H05K 9/0016; H05K 7/1038; H01L 23/4006; H01L 2023/4081; H01L 2924/0002
USPC ............. 361/79.54, 696, 697, 701, 702, 703, 361/704, 707, 709, 710, 711, 712, 715, 716, 361/720, 722, 723; 411/366.1
See application file for complete search history.

(56) References Cited

U.S. PATENT DOCUMENTS 5,594,624 A * 1/1997 Clemens ............. H01L 23/4093 174/16.3
5,648,890 A * 7/1997 Loo ..................... H01L 23/4006 257/1

(Continued)

FOREIGN PATENT DOCUMENTS

| JP | 2000-199514 | 7/2000 |
|----|-------------|--------|
| JP | 2001-187911 | 7/2001 |
| JP | 2011-155166 | 8/2011 |

OTHER PUBLICATIONS

Patent Abstracts of Japan, Publication No. 2000-199514, Published Jul. 18, 2000.

(Continued)

*Primary Examiner* — Anthony Haughton
*Assistant Examiner* — Matt Dhillon
(74) *Attorney, Agent, or Firm* — Staas & Halsey LLP

(57) ABSTRACT

A fixing-device that fixes a second member to be fastened to a first member to be fastened, the fixing-device includes, a base fixed to the first member to be fastened, a sprung-washer attached to the base and interposed between the base and the second member to be fastened, and a fastener that fastens the second member to be fastened and the base to each other, wherein the sprung-washer includes a threaded-portion insertion-hole into which a threaded-portion of the fastener is inserted, an edge-portion that is formed around the threaded-portion insertion-hole, and with which a pressing-portion provided in the fastener comes into contact and that is thereby pressed when the fastener is tightened, and a leaf-spring that extends from the edge-portion forward in a direction in which the fastener is inserted into the threaded-portion insertion-hole and outward, and that has a bent-portion midway along the length of the leaf-spring.

14 Claims, 9 Drawing Sheets

(56) References Cited

U.S. PATENT DOCUMENTS

| | | | | |
|---|---|---|---|---|
| 5,943,210 A * | 8/1999 | Lee | H01L 23/467 | 165/185 |
| 6,097,601 A * | 8/2000 | Lee | G06F 1/20 | 165/122 |
| 6,222,731 B1 * | 4/2001 | Katsui | H01L 23/40 | 165/121 |
| 6,552,905 B2 * | 4/2003 | Herring | H01L 23/4006 | 165/185 |
| 6,968,889 B2 * | 11/2005 | Wang | H01L 23/4006 | 165/185 |
| 7,126,824 B2 * | 10/2006 | Lee | H01L 23/4093 | 165/122 |
| 7,133,285 B2 * | 11/2006 | Nishimura | H05K 5/0265 | 165/185 |
| 7,310,229 B2 * | 12/2007 | Lee | H01L 23/4093 | 257/718 |
| 7,699,620 B2 * | 4/2010 | Lin | H01R 13/6275 | 439/330 |
| 7,742,310 B2 * | 6/2010 | Neumann | H05K 7/1431 | 361/759 |
| 7,990,722 B2 * | 8/2011 | Cao | H01L 23/4006 | 165/185 |
| 8,074,705 B2 * | 12/2011 | Lu | H01L 23/3672 | 165/67 |
| 8,254,128 B2 * | 8/2012 | Yasui | H01L 23/4006 | 165/80.2 |
| 8,256,736 B2 * | 9/2012 | Lin | F16B 5/0208 | 248/56 |
| 8,678,338 B2 * | 3/2014 | Lin | F16B 5/0208 | 248/609 |
| 8,757,575 B2 * | 6/2014 | Lin | H05K 7/142 | 248/346.03 |
| 8,794,889 B2 * | 8/2014 | Aukzemas | F16B 5/0208 | 411/107 |
| 8,867,211 B2 * | 10/2014 | Wiltzius | H01L 23/4006 | 165/80.3 |
| 8,922,999 B2 * | 12/2014 | Lai | H01L 23/4006 | 165/185 |
| 8,967,586 B2 * | 3/2015 | Zhu | F28F 3/06 | 165/104.33 |
| 2002/0093789 A1 * | 7/2002 | Sloan | H01L 23/4093 | 361/679.54 |
| 2004/0194926 A1 * | 10/2004 | Lee | H01L 23/467 | 165/80.3 |
| 2005/0152119 A1 * | 7/2005 | Lee | H01L 23/4093 | 361/710 |
| 2006/0098408 A1 * | 5/2006 | Lee | H01L 23/4093 | 361/697 |
| 2006/0176669 A1 * | 8/2006 | Chen | H01L 23/4006 | 361/704 |
| 2007/0091576 A1 * | 4/2007 | Wung | H01L 23/4006 | 361/719 |
| 2007/0227696 A1 * | 10/2007 | Lin | H01L 23/4006 | 165/80.3 |
| 2008/0287999 A1 * | 11/2008 | Markworth | A61B 17/7059 | 606/280 |
| 2009/0163068 A1 * | 6/2009 | yeh | H01R 12/88 | 439/331 |
| 2009/0311885 A1 * | 12/2009 | Cheng | G06F 1/20 | 439/65 |
| 2010/0053906 A1 * | 3/2010 | Liu | H01L 23/4006 | 361/720 |
| 2010/0204733 A1 * | 8/2010 | Rathbun | A61B 17/88 | 606/251 |
| 2011/0182035 A1 | 7/2011 | Yajima | | |
| 2012/0218712 A1 * | 8/2012 | Hayashi | H05K 7/2049 | 361/704 |
| 2013/0155624 A1 * | 6/2013 | Yang | H01L 23/4093 | 361/720 |
| 2013/0163207 A1 * | 6/2013 | Chen | H01L 23/4006 | 361/720 |
| 2014/0174695 A1 * | 6/2014 | Wang | F16B 41/002 | 165/76 |

OTHER PUBLICATIONS

Patent Abstracts of Japan, Publication No. 2001-187911, Published Jul. 10, 2001.

Japanese Office Action issued May 10, 2016 in corresponding Japanese Patent Application No. 2012-267456.

* cited by examiner

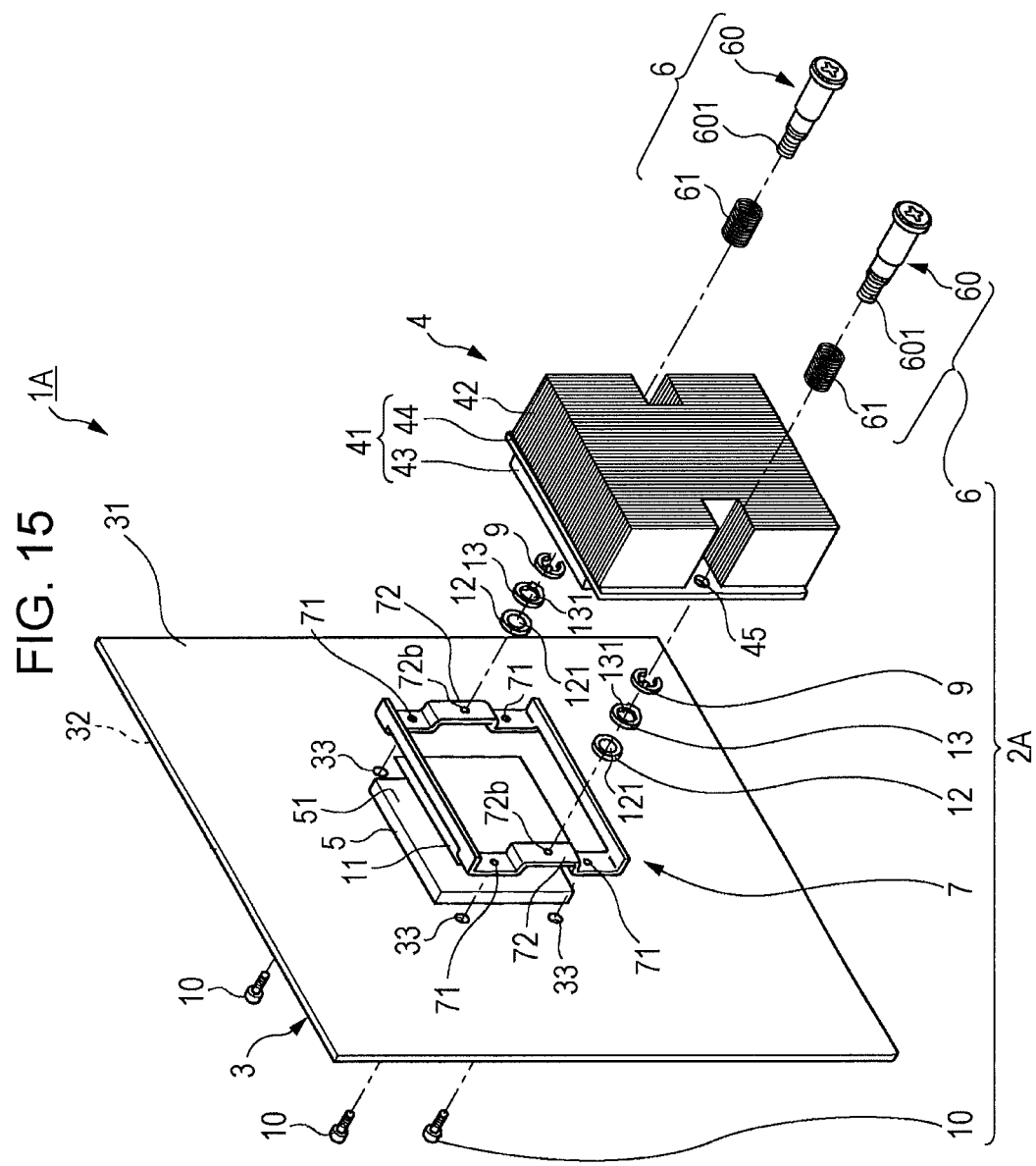

SPRUNG WASHER AND FIXING DEVICE

CROSS-REFERENCE TO RELATED APPLICATION

This application is based upon and claims the benefit of priority of the prior Japanese Patent Application No. 2012-267456, filed on Dec. 6, 2012, the entire contents of which are incorporated herein by reference.

FIELD

The embodiments discussed herein are related to a sprung washer and a fixing device.

BACKGROUND

A spring washer having a spring property is known as a member that suppresses loosening of a fastener such as a screw or bolt. The loosening of the fastener is suppressed by widening the gap between the bearing surface of the fastener and the bearing surface of a member to be fastened by the spring property of the spring washer. The spring washer is usually a plain washer split at one point and twisted out of shape so that it has a spring property. The spring washer is crushed between the bearing surface of the fastener and the bearing surface of the member to be fastened, and the spring property is thereby exerted.

As a method for cooling an electronic component mounted on a board of an electronic device, there is known a method including fixing a heat sink thermally in contact with the electronic component to the board. Usually, the heat sink is fixed, in a state pressed against the surface of the electronic component, to the board so that heat is easily transferred from the electronic component to the heat sink. When the heat sink is fastened to the board, a spring washer is sometimes used for the purpose of suppressing loosening of a fastener.

However, when the heat sink (one of the members to be fastened) is fastened, in a state pressed against the electronic component, to the board (the other member to be fastened), the force pressing the heat sink against the electronic component may be excessive if the fastener is tightened until the spring washer is crushed. As a result, when the heat sink is fixed to the board, the load exerted from the heat sink may exceed the allowable load of the electronic component, and the electronic component may be damaged.

Related arts are disclosed in Japanese Laid-open Patent Publication Nos. 2000-199514 and 2001-187911.

SUMMARY

According to an aspect of the embodiments, a fixing device that fixes a second member to be fastened to a first member to be fastened, the fixing device includes, a base fixed to the first member to be fastened, a sprung washer attached to the base and interposed between the base and the second member to be fastened, and a fastener that fastens the second member to be fastened and the base to each other, wherein the sprung washer includes a threaded portion insertion hole into which a threaded portion of the fastener is inserted, an edge portion that is formed around the threaded portion insertion hole, and with which a pressing portion provided in the fastener comes into contact and that is thereby pressed when the fastener is tightened, and at least one leaf spring that extends from the edge portion forward in a direction in which the fastener is inserted into the threaded portion insertion hole and outward, and that has a bent portion midway along the length of the leaf spring, and wherein when the fastener is tightened, the edge portion is pressed by the pressing portion with the bent portion in contact with the base, and the distal end of the leaf spring is thereby brought into contact with the second member to be fastened.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is an exploded perspective view of a board unit according to a second embodiment.

DESCRIPTION OF EMBODIMENTS

Sprung washers and fixing devices employing these sprung washers according to embodiments will be described below in detail by way of example with reference to the drawings. In the following embodiments, a case where a heat sink for cooling an electronic component mounted on a board is fixed to the board using a fixing device will be described as an example. However, the object of fixing using a fixing device is not limited to a particular object.

First Embodiment

Figure 1:
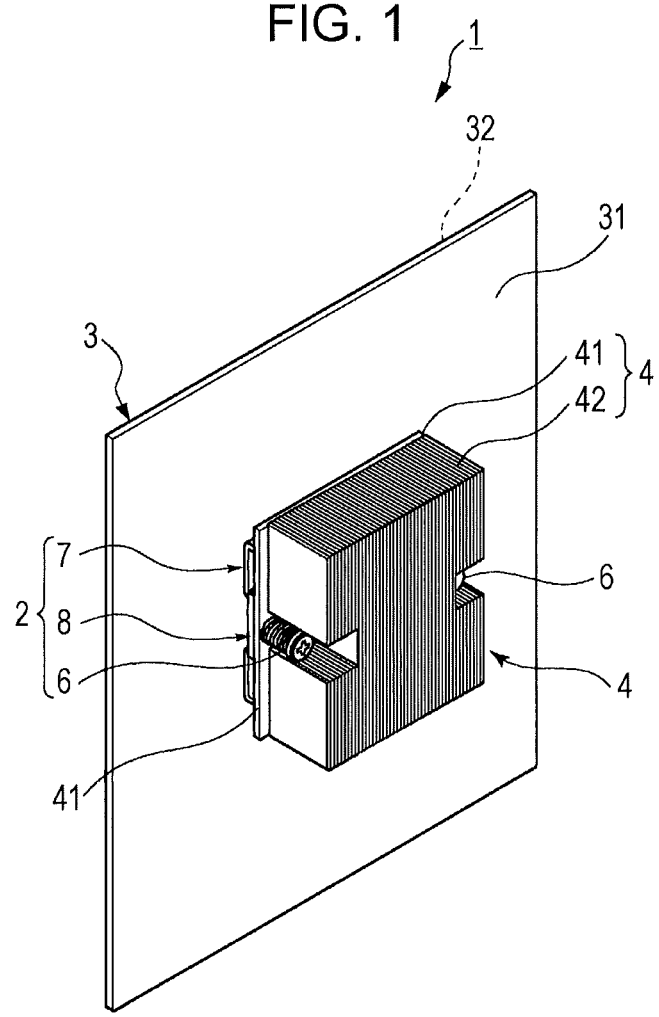
FIG. 1 is a perspective view of a board unit according to a first embodiment.
Figure 2:
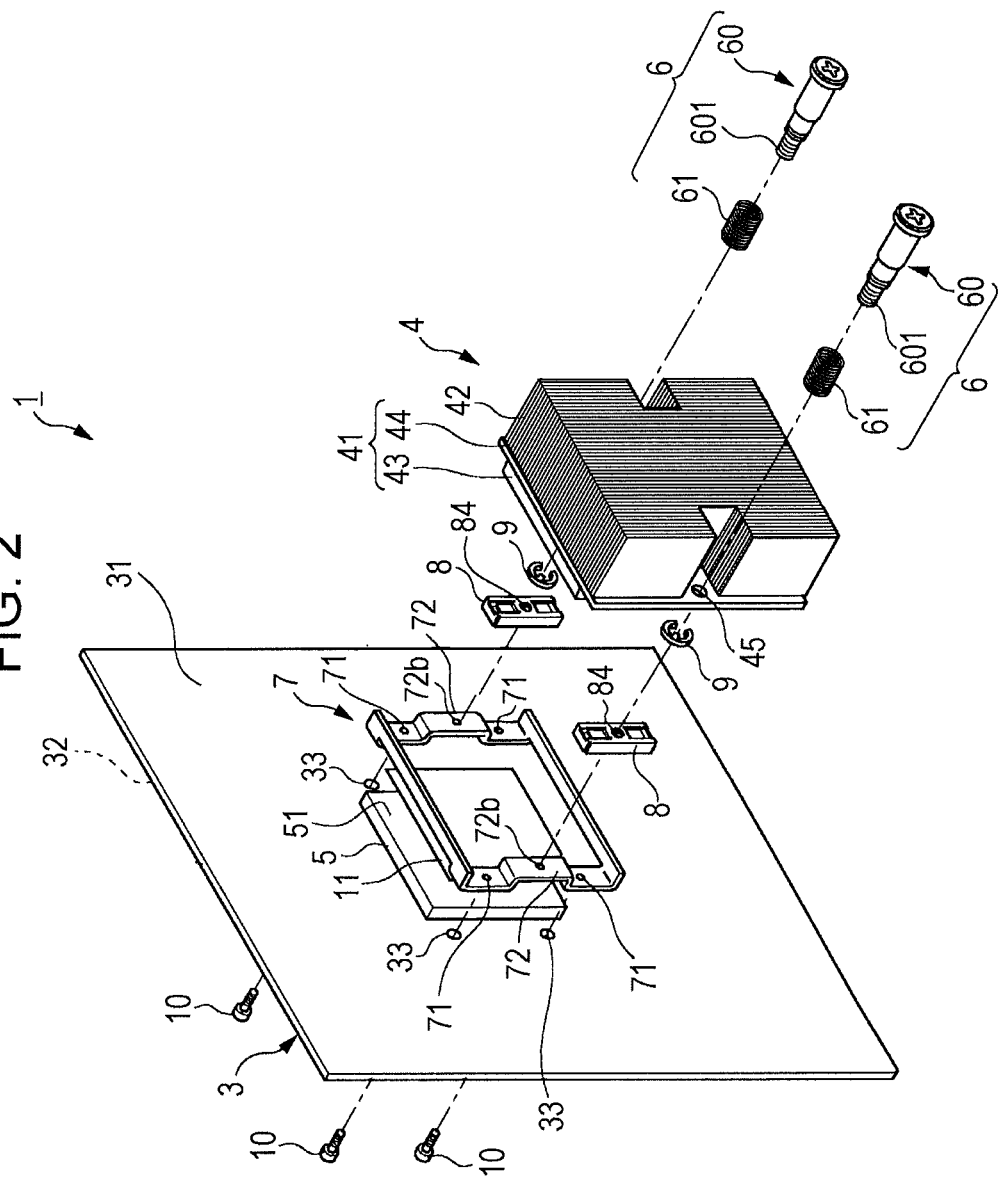
FIG. 2 is an exploded perspective view of the board unit according to the first embodiment.
Figure 3:
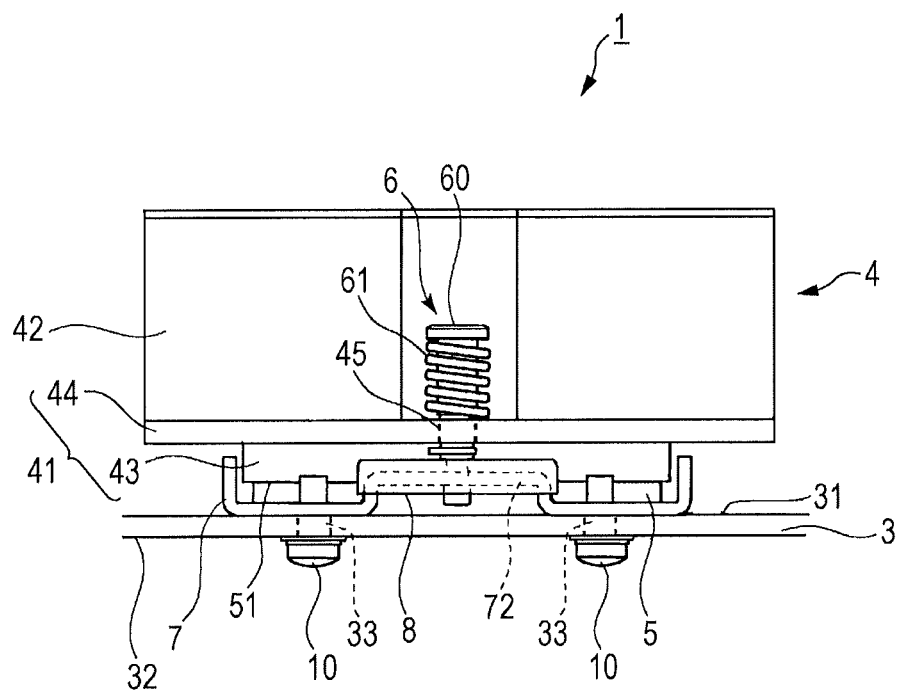
FIG. 3 is a side view of the board unit according to the first embodiment.

FIG. 1 is a perspective view of a board unit 1 in which a heat sink 4 is fixed to a board 3 using a fixing device 2 according to a first embodiment. FIG. 2 is an exploded perspective view of the board unit 1 according to the first embodiment. FIG. 3 is a side view of the board unit 1 according to the first embodiment.

The board 3 is, for example, a printed circuit board. An electronic component 5 that is a heat generating body and an object of cooling is mounted on the surface of the board 3. The electronic component 5 may be a semiconductor package such as a large scale integrated circuit or a central processing unit. A surface of the board 3 on which the electronic component 5 is mounted will be referred to as "mounting surface 31", and the opposite surface will be referred to as "non-mounting surface 32". The heat sink 4 is placed on a surface 51 of the electronic component 5 that does not face the mounting surface 31 of the board 3 (hereinafter referred to as "heat sink placing surface"), and cools the electronic component 5. Although in the example illustrated in FIG. 2 the electronic component 5 has a substantially rectangular parallelepiped shape, the shape of the electronic component 5 is not limited to this.

The heat sink 4 includes a base portion 41 and heat dissipation fins 42. The base portion 41 of the heat sink 4 includes a lid portion 43 that is placed on the heat sink placing surface 51 of the electronic component 5 with a thermal sheet 11 interposed therebetween, and a base plate 44 that has a cross-sectional area slightly greater than the cross-sectional area of the lid portion 43. The lid portion 43 and the base plate 44 in this embodiment both have a flat plate shape having a substantially quadrilateral plane. However, the shapes of the lid portion 43 and the base plate 44 may be changed. The term "cross-section" used above means a section along the planar direction of the lid portion 43 and the base plate 44. The cross-sectional area of the lid portion 43 is substantially equal to or slightly greater than the area of the heat sink placing surface 51 of the electronic component 5. The cross-sectional area of the base plate 44 is greater than the area of the heat sink placing surface 51 of the electronic component 5.

The thermal sheet 11, a so-called thermally conductive joining material, is sandwiched between the lid portion 43 of the heat sink 4 and the electronic component 5, and thereby joins both members. The thermal sheet 11 reduces the thermal resistance between the electronic component 5 and the lid portion 43 and facilitates heat transfer from the electronic component 5 to the lid portion 43. Examples of this type of thermally conductive joining material include, in addition to the thermal sheet 11, a thermal grease and a thermal compound. Instead of the thermal sheet 11, these may be used.

As illustrated in FIG. 2 and FIG. 3, insertion holes 45 for insertion of shaft portions of sprung screws 6 are formed in the base plate 44 of the heat sink 4. The insertion holes 45 are formed near a pair of opposite edges of the base plate 44. In this embodiment, two insertion holes 45 are provided in the base plate 44. However, the number of the insertion holes 45 may be changed. Since the insertion holes 45 are formed near the edges of the base plate 44, the insertion holes 45 do not overlap the lid portion 43.

The plurality of heat dissipation fins 42 are provided on the upper surface of the base plate 44, that is, the surface not connected to the lid portion 43. The heat dissipation fins 42 are thin heat dissipation plates fixed to the base plate 44. The heat dissipation fins 42 are arranged parallel to each other. Ventilation passageways extending in the same direction are defined between adjacent heat dissipation fins 42. The base portion 41 (the lid portion 43 and the base plate 44) and the heat dissipation fins 42 may be made of a metal material such as aluminum or copper.

Figure 4:
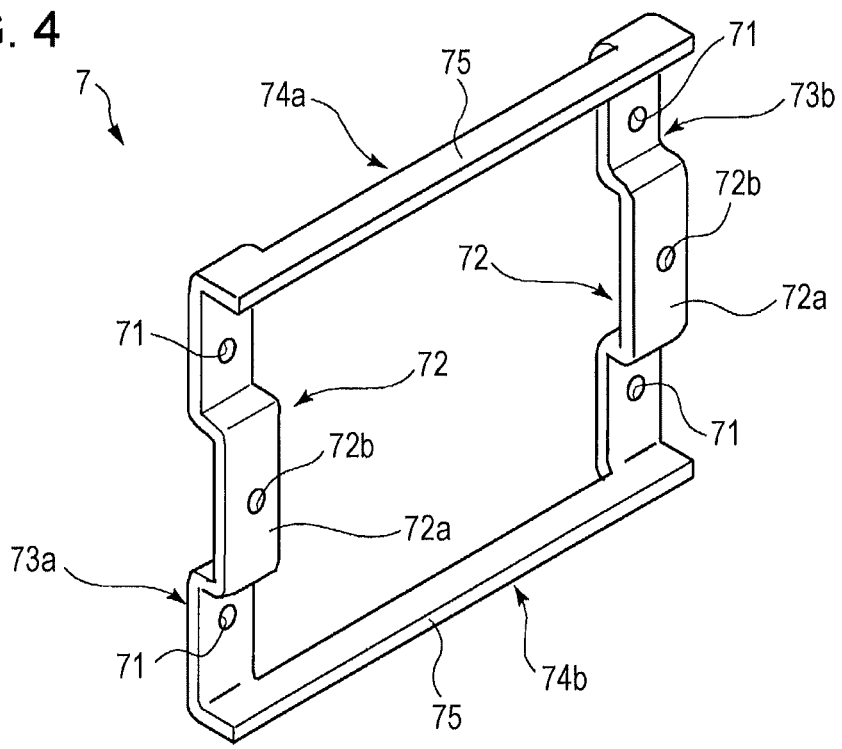
FIG. 4 is a perspective view of a base according to the first embodiment.
Figure 5:
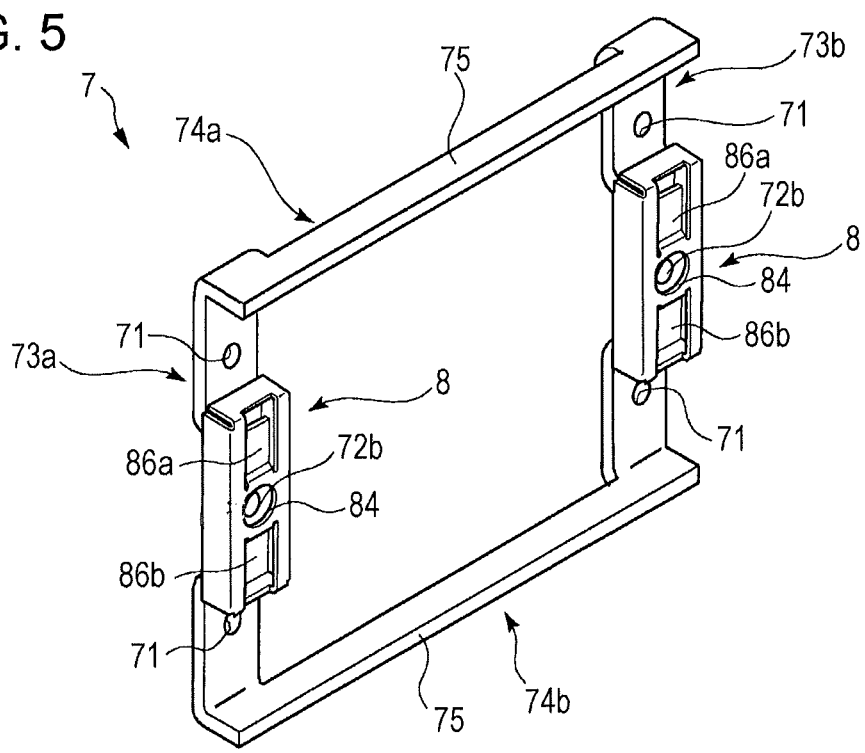
FIG. 5 illustrates a state where sprung washers are attached to the base according to the first embodiment.

Next, the details of the fixing device 2 according to this embodiment will be described. The fixing device 2 mainly includes a base 7, sprung washers 8 attached to the base 7, and the sprung screws 6. The fixing device 2 also includes fasteners such as E-type retaining rings 9 and fixing screws 10. FIG. 4 is a perspective view of the base 7 according to the first embodiment. FIG. 5 illustrates a state where the sprung washers 8 are attached to the base 7 according to the first embodiment. As illustrated in FIG. 4, the base 7 is a frame having a substantially quadrilateral shape in planar view, and first screw holes 71 are provided at the four corners of the base 7. The first screw holes 71 are internally threaded to receive the fixing screws 10.

As also illustrated in FIGS. 2 and 3, the base 7 is fastened to the board 3 with the fixing screws 10. The inner peripheral edge of the base 7 is slightly larger than the outline of the electronic component 5. Therefore, the base 7 may be attached to the mounting surface 31 of the board 3 so as to surround the electronic component 5 without interfering with the electronic component 5. As illustrated in FIG. 4, of the four sides forming the base 7, a pair of opposite short sides 73a and 73b have washer attachment portions 72 having a protruded shape. Second screw holes 72b are provided in the upper surfaces 72a of the washer attachment portions 72. The second screw holes 72b are internally threaded to receive the threaded portions 601 of the sprung screws 6.

Of the four sides forming the base 7, a pair of opposite long sides 74a and 74b have bent portions 75 that are erected by bending a plate forming the base 7 into a substantially L-shape. The washer attachment portions 72 are provided in the central parts of the short sides 73a and 73b. However, the positions where the washer attachment portions 72 are provided may be changed. The above-described first screw holes 71 are provided on both sides of the washer attachment portions 72 on the short sides 73a and 73b. Since the bent portions 75 are formed on the pair of long sides 74a and 74b of the base 7 as described above, the stiffness of the base 7 may be improved. Also in the washer attachment portions 72, the stiffness of the base 7 may be improved by bending the plate forming the base 7.

Figure 6:
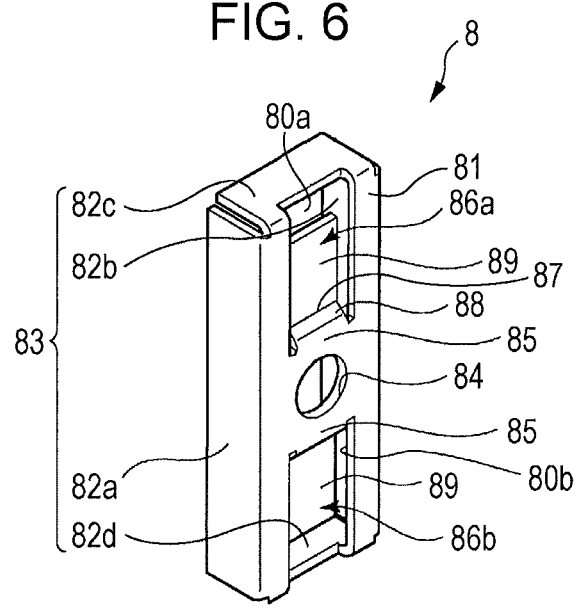
FIG. 6 is a perspective view of the sprung washer according to the first embodiment.
Figure 7:
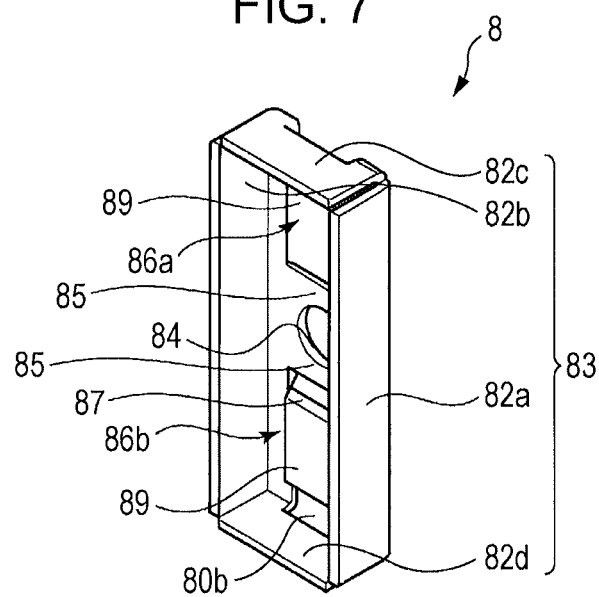
FIG. 7 is a perspective view of the sprung washer according to the first embodiment.

As illustrated in FIG. 5, the sprung washers 8 are attached to the washer attachment portions 72 of the base 7. FIG. 6 and FIG. 7 are perspective views of one of the sprung washers 8 in this embodiment. FIG. 6 mainly illustrates the outer side of the sprung washer 8, and FIG. 7 mainly illustrates the inner side of the sprung washer 8. The sprung washer 8 has a cap shape so as to overlie the washer attachment portion 72 of the base 7. The reference numeral 81 in FIG. 6 and FIG. 7 denotes a top plate portion that is disposed so as to face the upper surface 72a of the washer attachment portion 72 when the sprung washer 8 is attached to the washer attachment portion 72. Here, the top plate portion 81 of the sprung washer 8 is an example of a first plate portion.

In this embodiment, the top plate portion 81 of the sprung washer 8 has a substantially rectangular shape. Side wall portions 82a to 82d are erected on the outer edge, that is, the four edges of the top plate portion 81. The four side wall portions 82a to 82d form a frame portion 83 having a generally frame shape. Here, the relationship between the top plate portion 81 of the sprung washer 8 and the upper surface 72a of the washer attachment portion 72 will be mentioned. The length of the short sides of the top plate portion 81 is substantially equal to or slightly greater than the width of the upper surface 72a. The length of the long sides of the top plate portion 81 is substantially equal to or slightly greater than the length of the upper surface 72a. Therefore, the frame portion 83 of the sprung washer 8 may be fitted on the washer attachment portion 72, and the sprung washer 8 may be easily attached to the washer attachment portion 72 of the base 7.

As illustrated in FIG. 6 and FIG. 7, a threaded portion insertion hole 84 for insertion of the threaded portion 601 of the sprung screw 6 is provided near the central part of the top plate portion 81 of the sprung washer 8, through the plate in the thickness direction. When the heat sink 4 is attached to the board 3 using the fixing device 2 according to this embodiment, the heat sink 4 is fastened with the sprung screws 6 to the base 7 that is fastened and fixed with the fixing screws 10 to the board 3. At that time, as may be seen from FIG. 2 and FIG. 3, the base 7 and the heat sink 4 are fastened together with the sprung washers 8 attached to the washer attachment portions 72 of the base 7 interposed between the base 7 and the heat sink 4. At that time, the threaded portions 601 of the sprung screws 6 are inserted into the threaded portion insertion holes 84 from the outer side to the inner side of the sprung washers 8. In other words, the threaded portions 601 of the sprung screws 6 are inserted into the threaded portion insertion holes 84 from the upper side to the lower side of the top plate portion 81. Hereinafter, the direction in which the threaded portions 601 of the sprung screws 6 are inserted into the threaded portion insertion holes 84 of the sprung washers 8 will be referred to as "insertion direction". In this embodiment, the board 3 is an example of a first member to be fastened, and the heat sink 4 is an example of a second member to be fastened. The sprung screws 6 are an example of a fastener.

As illustrated in FIG. 6 and FIG. 7, an edge portion 85 is formed around the threaded portion insertion hole 84 of the top plate portion 81 of the sprung washer 8. The top plate portion 81 of the sprung washer 8 includes the edge portion 85 in the same plane. When the sprung screw 6 is tightened, a pressing portion provided in the sprung screw 6 comes into contact with the edge portion 85 of the top plate portion 81, and the edge portion 85 is thereby pressed. This pressing portion will be described later. The sprung washer 8 further includes a pair of leaf springs 86a and 86b. The leaf springs 86a and 86b extend from the edge portion 85 of the top plate portion 81, forward in the direction in which the sprung screw 6 is inserted into the threaded portion insertion hole 84 and outward. The leaf springs 86a and 86b have a substantially L-shape in cross-section, and have a bent portion 87 midway along the length thereof. Here, of the leaf springs 86a and 86b, a part on the proximal side of the bent portion 87 will be referred to as "first leaf spring portion 88", and a part on the distal side of the bent portion 87 will be referred to as "second leaf spring portion 89".

As described above, the leaf springs 86a and 86b have a first leaf spring portion 88, a second leaf spring portion 89, and a bent portion 87 formed at the boundary therebetween. The first leaf spring portions 88 of the leaf springs 86a and 86b are inclined to the edge portion 85 forward in the insertion direction of the sprung screws 6 and are connected to the edge portion 85. The second leaf spring portions 89 of the leaf springs 86a and 86b are inclined to the first leaf spring portions 88 and are connected to the first leaf spring portions 88. As illustrated in FIG. 5 to FIG. 7, the first leaf spring portion 88 is inclined and connected to the edge portion 85 such that the angle between the first leaf spring portion 88 and the edge portion 85 is an obtuse angle. The second leaf spring portion 89 is inclined and connected to the first leaf spring portion 88 such that the angle between the second leaf spring portion 89 and the first leaf spring portion 88 is an obtuse angle. The second leaf spring portion 89 is disposed along the planar direction of the top plate portion 81 (the edge portion 85). That is, the second leaf spring portions 89 of the leaf springs 86a and 86b are disposed substantially parallel to the edge portion 85.

The sprung washer 8 further has a pair of openings 80a and 80b formed in parts of the top plate portion 81 corresponding to the leaf springs 86a and 86b. The leaf springs 86a and 86b of the sprung washers 8 face the outside of the sprung washer 8 through the openings 80a and 80b. As may be seen from FIG. 6, the sizes and relative positions of the openings 80a and 80b and the leaf springs 86a and 86b are defined so that the edges of the openings 80a and 80b do not overlap the leaf springs 86a and 86b. In this embodiment, the openings 80a and 80b have a substantially rectangular shape. However, the openings 80a and 80b may have any other shape. The pair of leaf springs 86a and 86b of the sprung washer 8 extend from parts of the edge portion 85 substantially facing each other across the threaded portion insertion hole 84. When the sprung screws 6 are tightened, the second leaf spring portions 89 of the leaf springs 86a and 86b rise and pass through the pair of openings 80a and 80b of the sprung washer 8. The operation of the leaf springs 86a and 86b when the sprung screws 6 are tightened will be described later.

Figure 8:
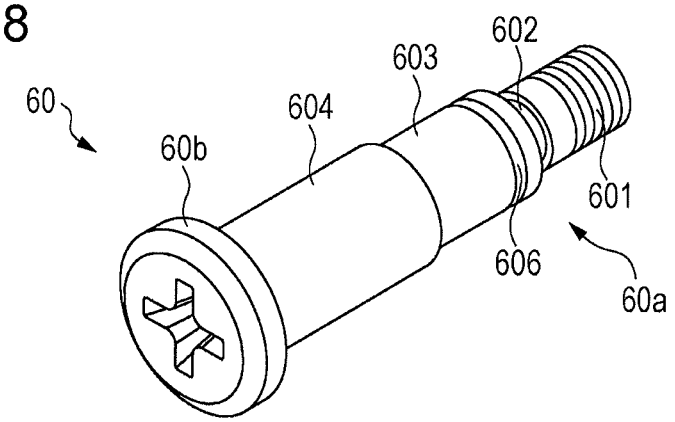
FIG. 8 illustrates a screw main body of a sprung screw according to the first embodiment.
Figure 9:
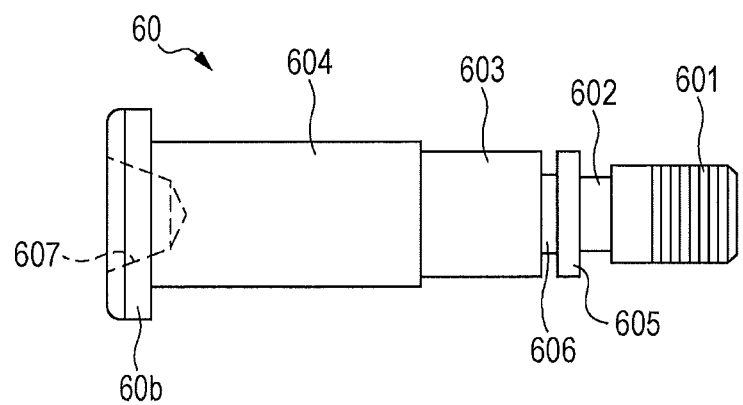
FIG. 9 illustrates a screw main body of a sprung screw according to the first embodiment.
Figure 10:
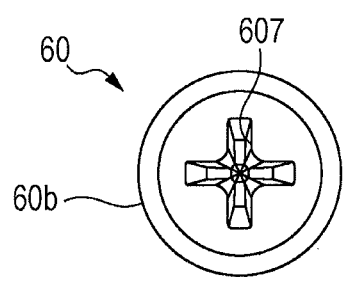
FIG. 10 illustrates a screw main body of a sprung screw according to the first embodiment.

Next, the details of the sprung screws 6 will be described. FIGS. 8 to 10 illustrate a screw main body 60 of the sprung screw 6. The sprung screw 6 includes a screw main body 60 and a spring 61. The screw main body 60 includes a shaft portion 60a and a head portion 60b. The shaft portion 60a includes, in order from the distal end thereof, the threaded portion 601, a small diameter portion 602, a first shank portion 603, and a second shank portion 604. The threaded portion 601 is externally threaded. The external thread of the threaded portion 601 may be screwed into the internal thread formed in the second screw hole 72b of the washer attachment portion 72 of the base 7.

The small diameter portion 602, which is smaller in diameter than the threaded portion 601, is connected to the rear end of the threaded portion 601. The first shank portion 603, which is larger in diameter than the small diameter portion 602, is connected to the rear end of the small diameter portion 602. The external diameters of the threaded portion 601 and the small diameter portion 602 are less than the internal diameter of the threaded portion insertion hole 84 of the sprung washer 8. The first shank portion 603 is larger in diameter than the small diameter portion 602. A pressing portion 605 is formed at the front end of the first shank portion 603. The external diameter of the pressing portion 605 is greater than the diameter of the threaded portion insertion hole 84 of the sprung washer 8. The pressing portion 605 may not pass through the threaded portion insertion hole 84. An E-type retaining ring attachment portion 606 that is smaller in diameter than the first shank portion 603 is formed midway along the length of the first shank portion 603. The E-type retaining ring 9 illustrated in FIG. 2 may be attached to the E-type retaining ring attachment portion 606.

The second shank portion 604, which is slightly larger in external diameter than the first shank portion 603, is connected to the rear end of the first shank portion 603. The head portion 60b, which is much larger in external diameter than the second shank portion 604, is connected to the rear end of the second shank portion 604. The head portion 60b is provided with a slot 607. The internal diameter of the insertion holes 45 formed in the base plate 44 of the heat sink 4 is greater than the external diameter of the first shank portion 603 of the screw main body 60 and is less than the external diameter of the second shank portion 604 of the screw main body 60. As illustrated in FIG. 2, the spring 61 is placed on the shaft portion 60a of the screw main body 60.

Next, a description will be given of the process of fixing the heat sink 4 to the board 3 using the fixing device 2 according to this embodiment, and the operation of the sprung washers 8 at the time of fixing the heat sink 4. As illustrated in FIG. 2, first, the board 3, on the mounting surface 31 of which the electronic component 5 is mounted, is prepared. Next, the base 7 is fastened to the mounting surface 31 of the board using the fixing screws 10. As illustrated in FIG. 2, screw insertion holes 33 into which the fixing screws 10 are inserted are provided through the board 3. When the base 7 is fastened, the fixing screws 10 are inserted into the screw insertion holes 33 from the non-mounting surface 32 side of the board 3, and then the fixing screws 10 are screwed into the first screw holes 71 of the base 7. By screwing all of the fixing screws 10 into the first screw holes 71, the attachment of the base 7 to the board 3 is completed.

Figure 11:
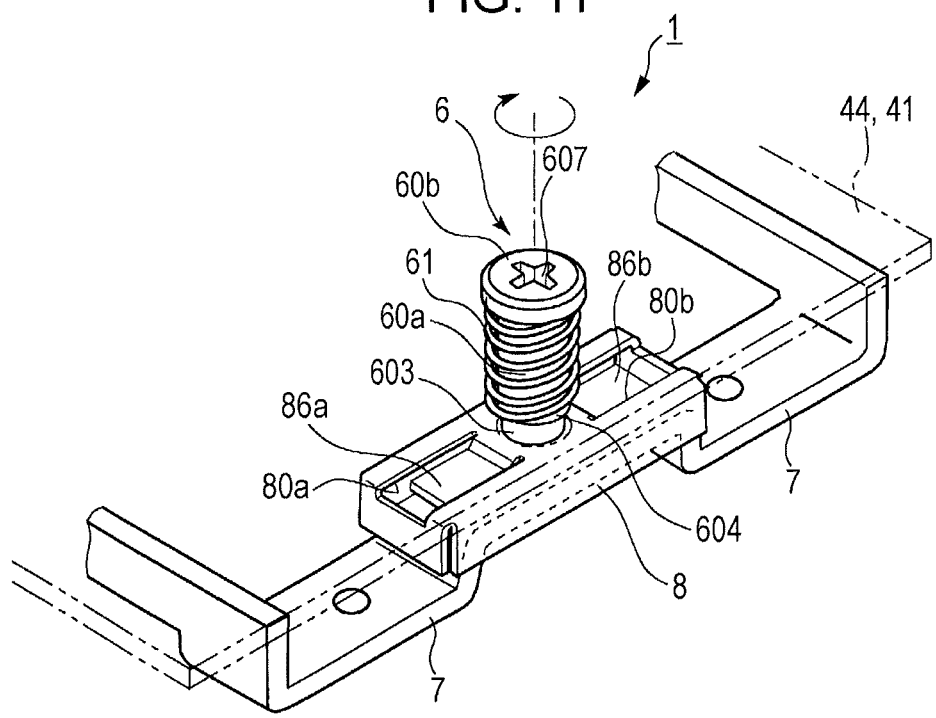
FIG. 11 illustrates a state where the sprung washer is attached to the washer attachment portion of the base.
Figure 12:
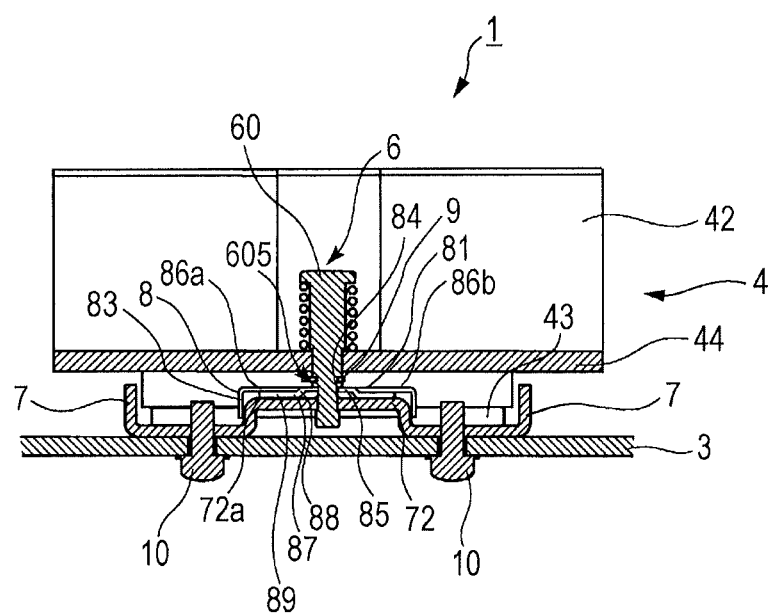
FIG. 12 illustrates a state when the pressing portion of the sprung screw has just come into contact with the edge portion of the sprung washer in the process of tightening the sprung screw.

Next, as illustrated in FIGS. 2, 11 and 12, the heat sink 4 is placed on the heat sink placing surface 51 of the electronic component 5, with the sprung washers 8 attached to the washer attachment portions 72 of the base 7. At that time, the thermal sheet 11 is sandwiched between the heat sink placing surface 51 and the electronic component 5 and the lid portion 43 of the heat sink 4. The planar shape and size of the thermal sheet 11 are adjusted so as to roughly correspond to those of the heat sink placing surface 51 of the electronic component 5. Alternatively, the heat sink 4 may be placed on the heat sink placing surface 51 of the electronic component 5, with the threaded portions 601, small diameter portions 602, and first shank portions 603 of the sprung screws 6, to the screw main bodies 60 of which the springs 61 are attached, preliminarily inserted into the insertion holes 45 of the heat sink 4. In that case, after the sprung screws 6 are inserted into the insertion holes 45 of the heat sink 4, the E-type retaining rings 9 are attached to the E-type retaining ring attachment portions 606 of the first shank portions 603. The coming off of the sprung screws 6 from the insertion holes 45 may be thereby suppressed. The sprung screws 6 may be inserted into the insertion holes 45 of the heat sink 4 after the heat sink 4 is placed on the electronic component 5.

The threaded portion 601 of the sprung screw 6 inserted into the insertion hole 45 of the heat sink 4 and is inserted into the threaded portion insertion hole 84 of the sprung washer 8 as illustrated in FIG. 11. In this embodiment, the relationship between the sprung washer 8 and the washer attachment portion 72 is defined so that when the sprung washer 8 is overlaid on the washer attachment portion 72, the planar positions of the second screw hole 72b of the washer attachment portion 72 and the threaded portion insertion hole 84 of the sprung washer 8 coincide with each other (see FIG. 5). Therefore, the alignment of the second screw hole 72b of the washer attachment portion 72 and the threaded portion insertion hole 84 of the sprung washer 8 is completed just by overlaying the sprung washer 8 on the washer attachment portion 72. Therefore, from this state, the user may screw the threaded portion 601 of the sprung screw 6 into the second screw hole 72b of the washer attachment portion 72 of the base 7 by tightening the sprung screw 6 using a tool such as a screwdriver. That is, the user is not required to align the position of the threaded portion insertion hole 84 of the sprung washer 8 with the position of the second screw hole 72b of the washer attachment portion 72, and may easily assemble the board unit 1. The workability at the time of assembling the board unit 1 may be thereby improved.

As the sprung screw 6 is tightened, the pressing portion 605 formed at the front end of the first shank portion 603 gradually approaches the top plate portion 81 of the sprung washer 8. As described above, the external diameter of the pressing portion 605 is greater than the diameter of the threaded portion insertion hole 84 of the sprung washer 8. Therefore, if the amount of screwing of the sprung screw 6 increases, the pressing portion 605 of the sprung screw 6 comes into contact with the edge portion 85 of the sprung washer 8 at a certain point in time. FIG. 12 illustrates a state when the pressing portion 605 of the sprung screw 6 has just come into contact with the edge portion 85 of the sprung washer 8 in the process of tightening the sprung screw 6.

Figure 13:
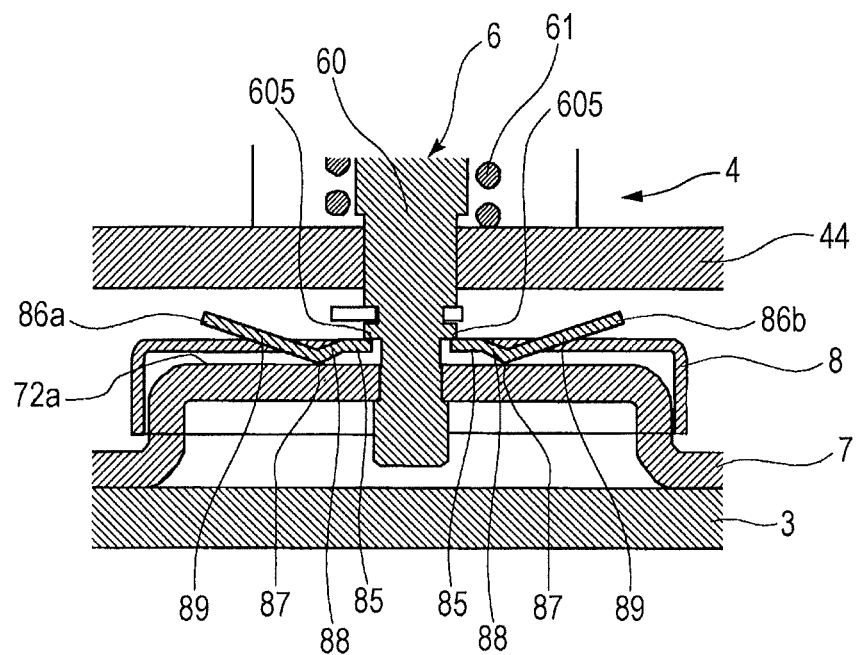
FIG. 13 illustrates the deformation of the leaf springs in the process of tightening the sprung screw.

As illustrated in FIG. 12, the bent portions 87 and the second leaf spring portions 89 of the leaf springs 86a and 86b of the sprung washer 8 attached to the washer attachment portion 72 of the base 7 are in contact with the upper surface 72a of the washer attachment portion 72. From this state, if the sprung screw 6 is further tightened, the edge portion 85 is pressed downward by the pressing portion 605 of the sprung screw 6, with the bent portions 87 in contact with the base 7. The whole sprung washer 8 is thereby lowered relative to the washer attachment portion 72. At that time, since the bent portions 87 are in contact with the upper surface 72a of the washer attachment portion 72, the first leaf spring portions 88 of the leaf springs 86a and 86b deform in a rotational manner relative to the edge portion 85 of the sprung washer 8 as illustrated in FIG. 13. More specifically, the first leaf spring portions 88 of the leaf springs 86a and 86b deform in such a manner that the angle between each first leaf spring portion 88 and the edge portion 85 of the sprung washer 8 increases compared to the state illustrated in FIG. 12. As a result, according to the principle of leverage, with the bent portions 87 serving as fulcrums, the second leaf spring portions 89 of the leaf springs 86a and 86b move upward, that is, toward the openings 80a and 80b. FIG. 13 illustrates a state where, in the process of tightening the sprung screw 6, the distal ends of the leaf springs 86a and 86b (the second leaf spring portions 89) of the sprung washer 8 have passed through the openings 80a and 80b.

Here, the base plate 44 of the heat sink 4 is disposed over the sprung washer 8 attached to the washer attachment portion 72 of the base 7. By further tightening the sprung screw, the deformation of the first leaf spring portions 88 relative to the edge portion 85 of the sprung washer 8 is made further significant. The upward movement of the second leaf spring portions 89 with the bent portions 87 serving as fulcrums progresses, and as illustrated in FIG. 14, the distal ends of the second leaf spring portions 89 come into contact with the base plate 44.

Figure 14:
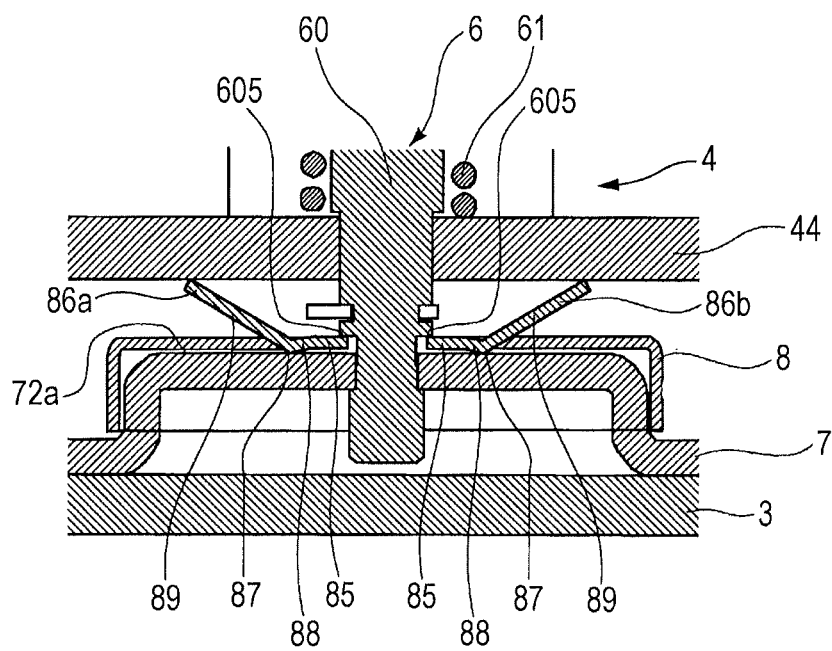
FIG. 14 illustrates the deformation of the leaf springs in the process of tightening the sprung screw.

In the state illustrated in FIG. 14, the proximal ends of the first leaf spring portions 88 of the leaf springs 86a and 86b are pressed against the pressing portion 605 of the sprung screw 6, with the edge portion 85 therebetween, and the distal ends of the second leaf spring portions 89 of the leaf springs 86a and 86b are pressed against the lower surface of the base plate 44. The bent portions 87 of the leaf springs 86a and 86b are pressed against the washer attachment portion 72 of the base 7. As described above, the sprung washer 8 according to this embodiment is in contact with the counterpart member at three points, namely, the bent portion 87, the first leaf spring portion 88, and the second leaf spring portion 89. As a result, the first leaf spring portion 88 and the second leaf spring portion 89 each function as a leaf spring, and a great spring property (spring force) is obtained by the whole sprung washer 8. At that time, the leaf springs 86a and 86b of the sprung washer 8 are not crushed by the base plate 44 and the base 7, and therefore the exertion of an excessive force on the electronic component 5 from the heat sink 4 may be suppressed. Therefore, even if the electronic component 5 is a general-purpose electronic component having a relatively small allowable load, such as a field-programmable gate array (FPGA), the load to which the electronic component 5 is subjected may be stopped from exceeding the allowable load when the heat sink 4 is fixed to the board 3. Therefore, when the heat sink 4 is fixed to the board 3, damage to the electronic component 5 may be effectively suppressed.

Consequently, the sprung washer 8 according to this embodiment may fulfill a sufficient loosening-suppressing function in an uncrushed state. That is, both the damage to the electronic component 5 and the loosening of the sprung screw 6 may be suppressed. If the height of the lid portion 43 of the heat sink 4 varies owing to the tolerance of thickness of the electronic component 5 or the thermal sheet 11, the sprung washer 8 may absorb the variation of the height.

The leaf springs 86a and 86b of the sprung washer 8 extend outward from parts of the edge portion 85 substantially facing each other across the threaded portion insertion hole 84, and therefore, as illustrated in FIG. 11, the sprung washer 8 may be attached in a stable position to the washer attachment portion 72 of the base 7. In the initial state before the tightening of the sprung screw 6, the second leaf spring portions 89 of the sprung washer 8 are disposed in a substantially horizontal position along the top plate portion 81 (the edge portion 85), and therefore the sprung washer 8 is stable relative to the washer attachment portions 72. That is, the sprung washer 8 may be attached to the washer attachment portion 72 in a more stable position. This helps to improve the work efficiency in assembling the board unit 1.

According to the fixing device 2 of this embodiment, the second screw hole 72b of the washer attachment portion 72 may be aligned with the threaded portion insertion hole 84 of the sprung washer 8 just by overlaying the sprung washer 8 on the washer attachment portion 72. The tightening of the sprung screw 6 may be performed immediately and smoothly while avoiding the trouble of having to dispose a plain washer and spring washer at the position of the second screw hole 72b of the base 7. The workability of assembling the board unit 1 may be thereby improved. The sprung washer 8 has the frame portion 83 (the side wall portions 82a to 82d) erected on the outer peripheral edge of the top plate portion 81. Therefore, after the sprung washer 8 is placed on the washer attachment portion 72, the planar positions of the second screw hole 72b and the threaded portion insertion hole 84 may be stopped from being misaligned. Therefore, compared to a case where a spring washer that is a plain washer split at one point and twisted out of shape so that it has a spring property is used, the workability of assembling the board unit 1 is excellent.

In this embodiment, the base 7 may be disposed on the mounting surface 31 side of the board 3, and therefore part of the non-mounting surface 32 located under the electronic component 5 may be used as a space for mounting another electronic component. Examples of such another electronic component include, but are not limited to, a bypass capacitor.

The base 7 according to this embodiment is fastened at its four corners to the board 3 with the fixing screws 10. This helps to suppress the warpage of the board 3. For example, when the board unit 1 according to this embodiment is arranged vertically in a rack, the board 3 warps easily owing to the weight of the heat sink 4. Even in such a case, the warpage of the board 3 may be effectively suppressed by fastening at least four corners of the base 7 having a frame shape to the board 3. The base 7 according to this embodiment has bent portions 75, and therefore the stiffness of the base 7 may be improved. By securing the stiffness of the base 7, the effect of suppressing the warpage of the board 3 may be further improved.

It may also be said that, in this embodiment, the sprung washer 8 is interposed between the heat sink 4 and the base 7, and the sprung screw 6 fastens the heat sink 4 and the base 7 to each other. In this case, the base 7 is taken as an example of a first member to be fastened, and the heat sink 4 is taken as an example of a second member to be fastened. Various modifications may be made to the fixing device 2 according to this embodiment. For example, the number of leaf springs provided in the sprung washer 8 may be changed. The sprung washer 8 in this embodiment does not necessarily have to have the frame portion 83. That is, the sprung washer 8 may have a top plate portion 81 having a threaded portion insertion hole 84 and an edge portion 85, and the above-described leaf springs 86a and 86b may extend from the edge portion 85. In that case, as described above, the number of leaf springs is not limited to a particular number.

Second Embodiment

Next, a second embodiment will be described. FIG. 15 is an exploded perspective view of a board unit 1A according to the second embodiment. The board unit 1A includes a board 3, a heat sink 4, and a fixing device 2A that fixes the board 3 and the heat sink 4 to each other. The fixing device includes a base 7, sprung screws 6, E-type retaining rings 9, fixing screws 10, plain washers 12, and spring washers 13. The base 7, the sprung screws 6, the E-type retaining rings 9, the fixing screws 10 are the same as those in the first embodiment, so the detailed description thereof will be omitted herein. The board unit 1A according to this embodiment does not have sprung washers 8, and has plain washers 12 and spring washers 13 instead of sprung washers 8.

In the fixing device 2A according to the second embodiment, the plain washers 12 and spring washers 13 are interposed between the base 7 and the heat sink 4. The heat sink 4 is fastened to the base 7 using the sprung screws 6. The plain washer 12 and the spring washer 13 have an insertion hole 121 and an insertion hole 131, respectively, into which the threaded portion 601 of the sprung screw 6 may be inserted.

The base 7 is fixed to the board 3 with the fixing screws 10 as in the first embodiment. At that time, the base 7 is formed as a frame that is disposed on the mounting surface 31 of the board 3 and that is disposed so as to surround the electronic component 5. Therefore, part of the non-mounting surface 32 of the board 3 located under the electronic component 5 may be used as a space for mounting another electronic component. As with the base 7 according to the first embodiment, the four corners are fastened to the board 3 using the fixing screws 10, and therefore the warpage of the board 3 may be suppressed. The bent portions 75 of the base 7 contribute to stiffness enhancement of the base 7, and therefore the effect of suppressing the warpage of the board 3 may be further expected.

In the fixing device according to this embodiment, the plain washers 12 and the spring washers 13 are interposed between the base 7 and the heat sink 4, and the spring washers 13 function to suppress the loosening of the sprung screws 6. That is, a spring property may be obtained by elastically deforming the spring washers 13 when the sprung screws 6 are tightened. In this embodiment, the sprung screws 6 are an example of a fastener.

The above embodiments may be implemented in combination if possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A fixing device, comprising:
   a base;
   a sprung washer directly connected to the base and interposed between the base and a member to be fastened to the base; and
   a fastener that extends through an opening in the member to be fastened and into the base to fasten the member to the base,
   wherein the sprung washer includes
   a threaded portion insertion hole into which a threaded portion of the fastener is inserted,
   an edge portion that is formed around the threaded portion insertion hole, and with which a pressing portion of the fastener comes into contact and that is thereby pressed when the fastener is tightened, and
   at least one leaf spring that extends from the edge portion in a direction in which the fastener is inserted into the threaded portion insertion hole and outward, and that has a bent portion along a length of the at least one leaf spring,
   wherein the leaf spring directly contacts the base, and
   wherein when the fastener is tightened, the edge portion is pressed by the pressing portion with the bent portion directly in contact with the base, and a distal end of the at least one leaf spring is thereby brought into direct contact with the member to be fastened.

2. The fixing device according to claim 1,
   wherein the at least one leaf spring has a first leaf spring portion that is inclined to the edge portion forward in the insertion direction of the fastener and is connected to the edge portion, and a second leaf spring portion that is inclined to the first leaf spring portion and is connected to the first leaf spring portion, and
   wherein the bent portion is formed at a boundary between the first leaf spring portion and the second leaf spring portion, and a distal end of the second leaf spring portion comes into contact with the member to be fastened when the fastener is tightened.

3. The fixing device according to claim 1, wherein the at least one leaf spring comprises a pair of leaf springs extending from the edge portion and facing each other across the threaded portion insertion hole.

4. The fixing device according to claim 2,
   wherein the base has a washer attachment portion having a protruded shape to which the sprung washer is attached, and
   wherein the sprung washer has a first plate portion that includes the edge portion in a same plane and that has an opening through which the second leaf spring portion is passed when the fastener is tightened, and a frame portion on an outer edge of the first plate portion and fitted on the washer attachment portion.

5. The fixing device according to claim 1,
   wherein the member to be fastened is a heat sink that cools an electronic component, and
   wherein the base is a frame connected to a surface of a board and surrounds the electronic component.

6. The fixing device according to claim 5, wherein the frame has a quadrilateral shape, and is fastened at four corners of the frame to the board.

7. A fixing device that fixes a heat sink, which heat sink cools an electronic component mounted on a board, to the board, the fixing device comprising:
   a base fixed to the board;
   a sprung washer directly connected to the base and interposed between the base and the heat sink; and
   a fastener that extends through an opening in the heat sink and into the base to fasten the heat sink to the base,
   wherein the sprung washer includes
   a threaded portion insertion hole into which a threaded portion of the fastener is inserted,
   an edge portion that is formed around the threaded portion insertion hole, and with which a pressing portion of the fastener comes into contact and that is thereby pressed when the fastener is tightened, and
   at least one leaf spring that extends from the edge portion in a direction in which the fastener is inserted into the threaded portion insertion hole and outward, and that has a bent portion midway along a length of the at least one leaf spring,
   wherein the leaf spring directly contacts the base, and
   wherein when the fastener is tightened, the edge portion is pressed by the pressing portion with the bent portion directly in contact with the base, and a distal end of the at least one leaf spring is thereby brought into direct contact with the heat sink.

8. A sprung washer interposed between a first member to be fastened and a second member to be fastened that are fastened to each other with a fastener, the sprung washer comprising:
   a flat plate portion that is positioned entirely between the first and second members to be fastened;
   a threaded portion insertion hole formed in the plate portion and into which a threaded portion of the fastener is inserted;
   an edge portion that is formed in the plate portion, around the threaded portion insertion hole, and with which a pressing portion of the fastener comes into contact and that is thereby pressed when the fastener is tightened, and
   at least one leaf spring that is disposed substantially parallel to the first plate portion and is entirely received between the first and second members to be fastened and extends from the edge portion in a direction in which the fastener is inserted into the threaded portion insertion hole and outward, and that has a bent portion along a length of the at least one leaf spring,
   wherein said at least one leaf spring is movable between a first position directly contacting the first member and a second position directly contacting both the first member and the second member, and
   wherein when the fastener is tightened, the edge portion is pressed by the pressing portion with the bent portion directly in contact with the first member to be fastened, and a distal end of the at least one leaf spring is thereby brought into direct contact with the second member to be fastened.

9. The sprung washer according to claim 8,
   wherein the at least one leaf spring has a first leaf spring portion that is inclined to the edge portion forward in the insertion direction of the fastener and is connected to the edge portion, and a second leaf spring portion that is inclined to the first leaf spring portion and is connected to the first leaf spring portion, and
   wherein the bent portion is formed at a boundary between the first leaf spring portion and the second leaf spring portion, and a distal end of the second leaf spring portion comes into contact with the second member to be fastened when the fastener is tightened.

10. The sprung washer according to claim 8, wherein the at least one leaf spring comprises a pair of leaf springs extending from the edge portion and facing each other across the threaded portion insertion hole.

11. The sprung washer according to claim 9, further comprising a first plate portion that includes the edge portion in a same plane and that has an opening through which the second leaf spring portion is passed when the fastener is tightened, and a frame portion that is erected on the outer edge of the first plate portion.

12. The fixing device according to claim 1, wherein the bent portion is located midway along the length of the at least one leaf spring.

13. The fixing device according to claim 7, wherein the bent portion is located midway along the length of the at least one leaf spring.

14. The fixing device according to claim 8, wherein the bent portion is located midway along the length of the at least one leaf spring.

* * * * *